United States Patent
Fuck et al.

(10) Patent No.: US 9,158,018 B2
(45) Date of Patent: Oct. 13, 2015

(54) WAVEFORM INVERSION USING A RESPONSE OF FORWARD MODELING

(75) Inventors: Rodrigo Fuck, Cambridge (GB);
Christopher H. Chapman, Great Shelford (GB); James Rickett, Cambridge (GB); Colin Thomson, Cambridge (GB)

(73) Assignee: WesternGeco L.L.C., Houston, TX (US)

( * ) Notice: Subject to any disclaimer, the term of this patent is extended or adjusted under 35 U.S.C. 154(b) by 731 days.

(21) Appl. No.: 13/333,620

(22) Filed: Dec. 21, 2011

(65) Prior Publication Data

US 2012/0259601 A1    Oct. 11, 2012

Related U.S. Application Data

(60) Provisional application No. 61/471,842, filed on Apr. 5, 2011.

(51) Int. Cl.
G06G 7/48 (2006.01)
G01V 1/30 (2006.01)
G01V 1/28 (2006.01)
G06F 17/50 (2006.01)

(52) U.S. Cl.
CPC ............ *G01V 1/301* (2013.01); *G01V 1/282* (2013.01); *G01V 1/307* (2013.01); *G06F 17/50* (2013.01)

(58) Field of Classification Search
CPC ....... G01V 1/282; G01V 1/301; G01V 1/307; G01V 17/50
USPC .......................................................... 703/7, 6
See application file for complete search history.

(56) References Cited

U.S. PATENT DOCUMENTS

| | | |
|---|---|---|
| 5,588,032 A | 12/1996 | Johnson et al. |
| 6,021,094 A | 2/2000 | Ober et al. |
| 6,418,379 B1 | 7/2002 | Bloor et al. |
| 6,522,973 B1 | 2/2003 | Tonellot et al. |
| 6,665,615 B2 | 12/2003 | Van Riel et al. |
| 6,895,336 B2 | 5/2005 | Trickett |
| 6,999,880 B2 | 2/2006 | Lee |
| 7,373,252 B2 | 5/2008 | Sherrill et al. |
| 7,725,266 B2 | 5/2010 | Sirgue et al. |
| 7,797,110 B2 | 9/2010 | Shin |
| 7,974,824 B2 | 7/2011 | Song |

(Continued)

FOREIGN PATENT DOCUMENTS

| | | |
|---|---|---|
| WO | 2004095074 A2 | 11/2004 |
| WO | 2004095074 A3 | 4/2005 |

(Continued)

OTHER PUBLICATIONS

Ikelle, L.T. "Linearized Inversion of 3-D Multi-Offset Data: Background Reconstruction and AVO Inversion", 1995, Geophysics Journal Int., RAS.*

(Continued)

*Primary Examiner* — Kamini S Shah
*Assistant Examiner* — Cedric D Johnson
(74) *Attorney, Agent, or Firm* — Abimbola Bukoye

(57) ABSTRACT

Forward modeling is performed to compute a response of a target structure, the forward modeling accounting for distortion of a reflected signal from a reflector in the target structure. Waveform inversion is performed using the response of the forward modeling.

24 Claims, 4 Drawing Sheets

(56) References Cited

U.S. PATENT DOCUMENTS

| | | |
|---|---|---|
| 8,086,426 B2 | 12/2011 | El Ouair et al. |
| 8,121,823 B2 | 2/2012 | Krebs et al. |
| 8,223,587 B2 | 7/2012 | Krebs et al. |
| 8,296,069 B2 | 10/2012 | Etgen et al. |
| 8,395,965 B2 | 3/2013 | Thomson |
| 8,537,638 B2 | 9/2013 | Lee et al. |
| 2008/0195358 A1 | 8/2008 | El Ouair et al. |
| 2009/0043545 A1 | 2/2009 | van Manen et al. |
| 2010/0018718 A1 | 1/2010 | Krebs et al. |
| 2010/0088035 A1 | 4/2010 | Etgen et al. |
| 2010/0110830 A1 | 5/2010 | Thomson |
| 2010/0142316 A1 | 6/2010 | Keers et al. |
| 2010/0302906 A1 | 12/2010 | Liu |
| 2011/0000678 A1 | 1/2011 | Krebs et al. |
| 2011/0090760 A1 | 4/2011 | Rickett et al. |
| 2011/0131020 A1 | 6/2011 | Meng |
| 2011/0194379 A1 | 8/2011 | Lee et al. |
| 2011/0222370 A1 | 9/2011 | Downton et al. |
| 2011/0235464 A1 | 9/2011 | Brittan et al. |
| 2011/0238390 A1 | 9/2011 | Krebs et al. |
| 2011/0246140 A1 | 10/2011 | Abubakar et al. |

FOREIGN PATENT DOCUMENTS

| | | |
|---|---|---|
| WO | 2011057151 A2 | 5/2011 |
| WO | 2011057151 A3 | 9/2011 |

OTHER PUBLICATIONS

Wu, Ru-Shan et al., "One-Way and One-Return Approximations (De Wolf Approximation) for Fast Elastic Wave Modeling in Complex Media", 2006, Advances in Geophysics, vol. 48, Chapter 5, Elsevier, Inc.*

Gelis, C. et al., Two-Dimensional Elastic Full Waveform Inversion using Born and Rytov Formulations in the Frequency Domain, 2007, Geophysics Journal Int., RAS.*

Wang, Ping et al., "Imaging the Lowermost Mantle (D") and the Core-Mantle Boundary with SKKS Coda Waves", 2008, Geophysics Journal Int., RAS.*

Hampson, Dan, "AVO Inversion, Theory and Practice", 1991, Geophysics: The Leading Edge of Exploration.*

Schuster, Gerard T., "Basics of Seismic Wave Theory", Mar. 23, 2007, University of Utah.*

White, Robert S. "Oceanic Upper Crustal Structure from Variable Angle Seismic Reflection—Refraction Profiles", Sep. 12, 1978, Geophys. J.R. astr. Soc., 57.*

Cary, et al., "Automatic 1-D waveform inversion of marine seismic refraction data", Geophysical Journal, vol. 93, 1988, pp. 527-546.

Chapman, C. H., "Real Slowness Methods", Section 8.4, Fundamentals of Seismic Wave Propagation: University Press, Cambridge, 2004, pp. 346-355.

Chapman, C. H., "First-Motion Approximations of WKBJ Seismograms", Section 9.2, Fundamentals of Seismic Wave Propagation: University Press, Cambridge, 2004, pp. 415-433.

Chapman, et al., "Least-squares fitting of marine seismic refraction data", Geophysical Journal of the Royal Astronomical Society, vol. 82 (3), Sep. 1985, pp. 339-374.

Chapman, C.H., "A new method for computing synthetic seismograms", Geophysical Journal of the Royal Astronomical Society, vol. 54 (3), Sep. 1978, pp. 481-518.

Doornbos, Durk J., "Seismological algorithms: computational methods and computer programs", Academic Press Limited, 1988, London, pp. 47-74.

Virieux, et al., "An overview of full-waveform inversion in exploration geophysics", Geophysics, vol. 74(6), 2009, pp. WCC127-WCC152.

International Search Report & Written Opinion issued in PCT/US2012/032239 on Nov. 1, 2012; 8 pages.

Philip Christie, Ian Gollifer and David Cowper, Borehole seismic studies of a volcanic succession from the Lopra-1/1A borehole in the Faroe Islands, northern North Atlantic, Geological Survey of Denmark and Greenland Bulletin 9, 2006, pp. 23-40.

Philip Christie et al., iSIMM Looks Beneath Basalt for Both Industry and University Research, 5th Conference & Exposition on Petroleum Geophysics, Hyderabad-2004, India, pp. 186-193.

Z. Lunnon et al., An Evaluation of Peak and Bubble Tuning in Sub-Basalt Imaging: Modelling and Results, EAGE 65th Conference & Exhibition—Stavanger, Norway, Jun. 2-5, 2003 (4 pages).

Subhashis Mallick, Case History Some practical aspects of prestack waveform inversion using a genetic algorithm: An example from the east Texas Woodbine gas sand, Geophysics, vol. 64, No. 2, (Mar.-Apr. 1999); pp. 326-336, 14 Figs.

Andreas Rugern P-wave reflection coefficients for transversely isotropic models with vertical and horizontal axos of symmetry, Geophysics, vol. 62, No. 3, (May-Jun. 1997); pp. 713-722, 7 Figs., 1 Table.

R. T. Shuey, A simplification of the Zoeppritz equations, Geophysics. vol. 50, No. 4 (Apr. 1985); pp. 609-614, 8 Figs., 7, Tables.

Mirko van der Baan and Dirk Smit, Amplitude analysis of isotropic P-wave reflections, Geophysics,vol. 71, No. 6 Nov.-Dec. 2006; P. C93-C103, 7 Figs., 2 Tables.

Chapman et al., The WKBJ Seismogram Algorithm, Seismological Algorithms, 1988 (28 pages).

Ursenbach et al., An Efficient Method for AVO Modeling of Reflected Spherical Waves, Journal of Seismic Exploration 16, 2007, pp. 79-104.

Chris Chapman, Fundamentals of Seismic Wave Propagation, Cambridge University Press, 2004 (13 pages).

Nocedal et al., Numerical Optimization, Springer Series in Operations Research, 1999 (10 pages).

Aki et al., Quantitative Seismology—Second Edition, pp. vii, 119, 147-148, 700 2002 (8 pages total).

* cited by examiner

WAVEFORM INVERSION USING A RESPONSE OF FORWARD MODELING

CROSS REFERENCE TO RELATED APPLICATION

This application claims benefit under 35 U.S.C. §119(c) of U.S. Provisional Application Ser. No. 61/471,842, entitled "PERFORMING WAVEFORM INVERSION," filed Apr. 5, 2011, which is hereby incorporated by reference.

BACKGROUND

Survey operations can be performed to characterize content of a subterranean structure. Examples of survey operations include seismic survey operations. Survey operations can be performed using survey equipment deployed at or above an earth surface that is above the subterranean structure of interest. Alternatively, part or all of the survey equipment can be deployed in wellbore(s).

Once survey data is acquired, the survey data can be analyzed to estimate properties of the subterranean structure.

SUMMARY

In general, according to some implementations, a method includes performing forward modeling to compute a response of a target structure that includes a reflector, the forward modeling using reflection information relating to the reflector and accounting for distortion of a reflected signal reflected from the reflector. Waveform inversion is performed using the response of the forward modeling.

In general, according to further implementations, a system includes at least one processor to compute a response of a target structure that includes partial and total reflections from a reflector in the target structure, where the response is computed using forward modeling that uses reflection information relating to the reflector. The at least one processor is, based on the response, to produce at least one parameter of the target structure using waveform inversion.

In general, according to other implementations, an article includes at least one machine-readable storage medium storing instructions that upon execution cause a system to perform forward modeling to compute a response of a target structure including a reflector, the forward modeling using reflection information relating to the reflector and accounting for distortion of a reflected signal reflected from the reflector. Waveform inversion is performed using the response of the forward modeling.

In further or other implementations, the reflection information includes reflection coefficients relating to the reflector.

In further or other implementations, the forward modeling accounts for distortion of the reflected signal due to an incident signal impinging on the reflector at a near-critical angle that is less than, at or greater than a critical angle.

In further or other implementations, the distortion of the reflected signal is caused by interference with a head wave associated with energy that travels generally parallel to the reflector.

In further or other implementations, performing the waveform inversion produces at least one parameter that represents at least one characteristic of the target structure.

In further or other implementations, the at least one parameter is selected from the group consisting of a velocity, a density, and an elastic property.

In further or other implementations, performing the waveform inversion comprises performing amplitude variation with offset (AVO) inversion.

In further or other implementations, performing the forward modeling comprises performing WKBJ (Wentzel, Kramer, Brillouin, and Jeffreys) forward modeling.

In further or other implementations, the WKBJ forward modeling is performed for the reflector that reflects a reflected signal in response to an incident angle in a near-critical range. In addition, amplitude variation with offset (AVO) inversion is performed using forward modeling that does not account for distortion of a reflected signal reflected from a second reflector in the target structure in response to an incident signal that is at an angle less than a critical angle.

In further or other implementations, performing the waveform inversion comprises using a reference parameter to account for local lateral variation in the target structure.

In further or other implementations, the reference parameter includes a reference slowness parameter.

In further or other implementations, performing the waveform inversion comprises performing a first optimization stage and a second optimization stage, the first optimization stage to find an initial model of the target structure, and the second optimization stage to produce the at least one parameter based on the initial model.

In further or other implementations, the first optimization stage measures a misfit between actual survey data and synthetic data to find the initial model, the actual survey data acquired by survey receivers, and the synthetic data produced by the forward modeling.

In further or other implementations, the misfit is between an envelope of the actual survey data and an envelope of the synthetic data.

In further or other implementations, survey data acquired for the target structure is preprocessed to produce survey data corresponding to a virtual survey arrangement in the subsurface.

In further or other implementations, the forward modeling accounts for interference between reflected signals from the reflector and a head wave.

In further or other implementations, the target structure is a subterranean structure.

Other or alternative features will become apparent from the following description, from the drawings, and from the claims.

BRIEF DESCRIPTION OF THE DRAWINGS

Some embodiments are described with respect to the following figures.

DETAILED DESCRIPTION

Figure 1:
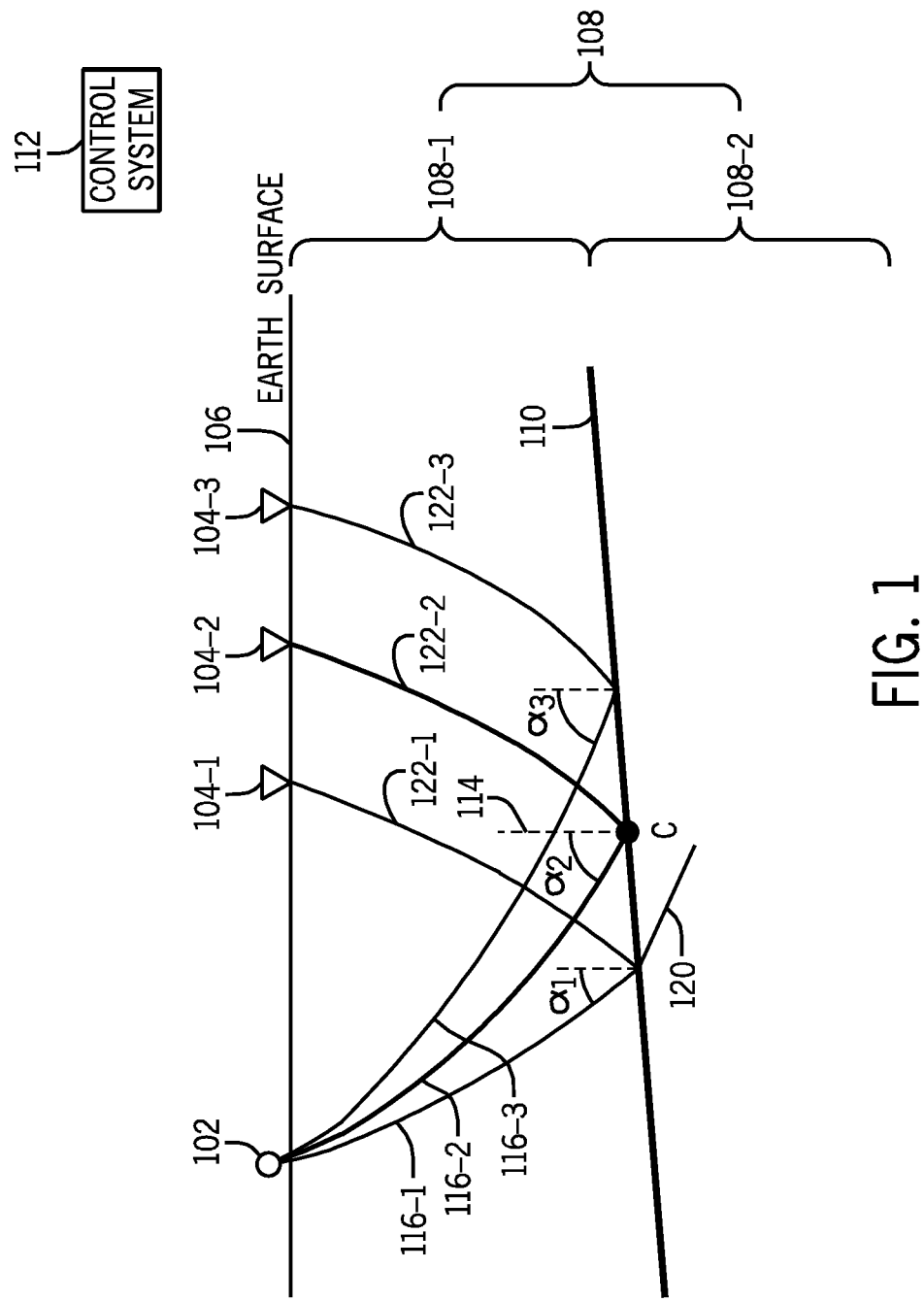
FIG. 1 is a schematic diagram of an arrangement with which a survey operation can be performed, according to some examples.

FIG. 1 shows an example survey arrangement that has a survey source 102 and survey receivers 104-1, 104-2, and 104-3. Even though specific numbers of the survey source 102 and survey receivers 104-1 to 104-3 are shown in FIG. 1, note that in other examples, other numbers of survey sources and survey receivers can be used. The survey source 102 and survey 104-1 to 104-3 are placed at an earth surface 106. In some examples, the earth surface 106 can be a land surface or a seafloor. In other implementations, a wellbore can be drilled into a subterranean structure 108, such that the survey source 102 and/or survey receivers 104-1 to 104-3 can be placed in the wellbore below the earth surface 106.

In another implementation, instead of the surface 106 being the earth surface, the surface 106 can be a subterranean surface determined using preprocessing (such as imaging to extrapolate the surface 106 to some depth below the earth surface). The preprocessing produces subsurface data, which can include either common-image point gather data or reflection-operator data. In such implementation, the source(s) 102 and receivers 104-1 to 104-3 are virtual source(s) and receivers, which form part of a virtual survey arrangement. The preprocessing is applied to survey data acquired for the subterranean structure, and the preprocessing produces survey data corresponding to the virtual survey arrangement in the subsurface.

In some examples, the survey source 102 is a seismic survey source (e.g., airgun, vibrator, explosive, etc.), and the survey receivers 104-1 to 104-3 are seismic receivers (e.g., geophones, accelerometers, etc.). The seismic source 102 can produce a seismic wave that is propagated into the subterranean structure 108. A reflector 110 in the subterranean structure 108 can cause reflection of the incident seismic wave from the survey source 102. Reflected seismic waves can be detected by the seismic receivers 104-1 to 104-3.

Although reference is made to a seismic wave propagated into a subterranean structure in the ensuing discussion, it is noted that techniques or mechanisms according to some embodiments can also be applied to other types of target structures, such as human tissue, a mechanical structure, and so forth.

More generally, the survey source 102 is considered to produce an incident signal that is transmitted into a target structure, and portions of the transmitted incident signal reflected by one or more reflectors in the target structure are detected by the survey receivers 104-1 to 104-3.

Data acquired by the survey receivers 104-1 to 104-3 are communicated to a control system 112. The communication can be over a wired communications medium and/or a wireless communications medium. In other examples, other techniques (such as storing the acquired survey data on a removable storage medium that is then transferred to the control system 112 for upload to the control system 112) can be used. The control system 112 is able to apply waveform inversion techniques according to some implementations.

Waveform inversion refers to a technique that reconstructs at least one parameter that represents a corresponding characteristic of the subterranean structure 108, based on received survey data (such as those acquired by the survey receivers 104-1 to 104-3). As examples, the at least one parameter can be selected from among a velocity in the subterranean structure 108, a density of the subterranean structure 108, or an elastic property of the subterranean structure 108. In other examples, waveform inversion can produce other types of parameters representing other properties of the subterranean structure 108.

As further shown in FIG. 1, incident signals can have different incident angles with respect to an axis 114 that is normal (perpendicular) to the reflector 110. In examples according to FIG. 1, an incident signal 116-1 from the seismic source 102 has an incident angle $\alpha_1$ with respect to the normal axis 114, an incident signal 116-2 has an incident angle $\alpha_2$ with respect to the normal axis 114, and an incident signal 116-3 has an incident angle of $\alpha_3$ with respect to the normal axis 114, where $\alpha_1 < \alpha_2 < \alpha_3$. The incident angle $\alpha_1$ of the incident signal 116-1 is less than a critical angle, such that a portion of the incident signal 116-1 passes from a first portion 108-1 of the subterranean structure 108 (on one side of the reflector 110) to a second portion 108-2 of the subterranean structure 108 (on another side of the reflector 110). The portion of the incident signal 116-1 that passes through the reflector 110 is a refracted signal 120.

Another portion of the incident signal 116-1 is reflected as reflected signal 122-1, which can be detected by the receiver 104-1. The reflected signal 122-1 is considered a "partial reflected signal," since a portion of the incident signal 116-1 has passed through the reflector 110 as the refracted signal 120. Generally, an incident signal that has an incident angle less than the critical angle results in a portion of the incident signal passing through the reflector 110 as a refracted signal, and another portion of the incident signal being reflected as a reflected signal.

However, when the incident angle of the incident signal (such as incident signal 116-2) reaches the critical angle (in this case $\alpha_2$), total reflection of the incident signal 116-2 from the reflector 110 occurs, resulting in reflected signal 122-2. Similarly, the incident signal 116-3, which has an incident angle greater than the critical angle, also experiences total reflection from the reflector 110, resulting in reflected signal 122-3. The reflected signals 122-2 and 122-3 are considered total reflected signals, since no refracted signals (that pass through the reflector 110) result from respective incident signals 116-2 and 116-3.

An incident signal that impinges on the reflector 110 at an incident angle that is at or greater than the critical angle causes a head wave to be generated. The head wave is associated with a refracted signal in subterranean portion 108-2 that propagates in a direction that is parallel to the reflector 110. The head wave can interfere with the corresponding reflected signal (e.g., 122-2 or 122-3 in FIG. 1). This interference can lead to distortion of the reflected signal. Generally, reflected signals that are reflected from the reflector 110 in response to incident signals that have incident angles around and close enough to the critical angle are subject to distortion due to interference from respective head waves.

Some waveform inversion techniques rely on use of just pre-critical reflection data (which includes reflected signals responsive to incident signals that have incident angles less than the critical angle). Effectively, such waveform inversion techniques rely on near-offset data (data acquired by survey receivers that are relatively closer to the survey source, such as survey receiver 104-1 that is relatively closer to the survey source 102 in FIG. 1 than survey receivers 104-2 and 104-3). These waveform inversion techniques are unable to use long-offset data, which includes data acquired by survey receivers that are relatively farther away from the survey source 102 (e.g., 104-2 and 104-3 in FIG. 1), since these long-offset survey receivers detect distorted reflected signals responsive to incident signals that have incident angles at or greater than the critical angle.

In accordance with some embodiments, techniques or mechanisms are provided to allow for use of acquired survey data that includes pre-critical, near-critical, and post-critical reflection data. Near-critical reflection data includes reflected signals responsive to incident signals having incident angles within a predefined range ("near-critical range") that starts just before the critical angle and extends to a predefined angle just larger than the critical angle. Post-critical reflection data includes reflected signals responsive to incident signals having incident angles greater than the incident angles in the near-critical range.

The ability to perform waveform inversion using pre-critical reflection data, near-critical reflection data, and post-critical reflection data allows for greater flexibility, since survey data acquired with a larger number of survey receivers can be used in the waveform inversion.

Figure 2:
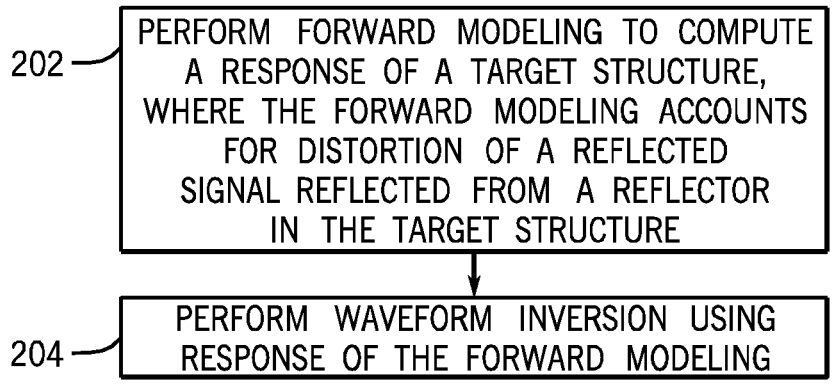
FIGS. 2 and 3 are flow diagrams of processes according to various implementations.

A process according to some implementations is shown in FIG. 2. The process includes performing (at 202) forward modeling to compute a response of a target structure (e.g., subterranean structure 108 in FIG. 1 or other type of structure). Forward modeling generally refers to estimating what a response of a target structure would be, based on use of a model of the target structure. In accordance with some embodiments, the forward modeling that is performed accounts for distortion of a reflected signal that is reflected from a reflector in the target structure, such as distortion caused by interference with a head wave produced when an incident signal on a reflector has an incident angle in the near-critical range. By using forward modeling that accounts for such distortion of a reflected signal, the waveform inversion process can use pre-critical reflection data as well as near-critical and post-critical reflection data, as discussed above. Examples of forward modeling accounting for distortion of a reflected signal can include, but are not limited to, any of the following: the forward modeling computing a response that includes a contribution from a signal component (e.g., a head wave as discussed above) that interferes with the reflected signal; the forward modeling computing a response that is based in part on the presence of interference by a signal component (e.g., a head wave) with the reflected signal; or the forward modeling computing a response that considers a representation of interference by a signal component (e.g., a head wave) with the reflected signal.

The process performs (at 204) waveform inversion using the response of the forward modeling. The waveform inversion produces at least one parameter that represents a characteristic of the target structure. As examples, the at least one parameter can include any one or more of the following: elastic property, velocity, and density.

In some implementations, the forward modeling that is performed at 202 includes a WKBJ (Wentzel, Kramer, Brillouin, and Jeffreys) forward modeling technique, which produces a synthetic seismogram. A synthetic seismogram is a model of energy (e.g., acoustic or other type of energy) traveling through various elements (e.g., layers or other elements) of a target structure (e.g., subterranean structure).

The waveform inversion applied at 204 according to some implementations can include an amplitude variation with offset (AVO) inversion. AVO inversion involves analyzing variation in amplitudes of undistorted reflected signals with change in distance between a survey source and survey receivers that indicates differences in lithology and fluid content in the target structure (both above and below a target element of interest, which in the case of FIG. 1 is the reflector 110).

Some AVO waveform inversion techniques can use a 1D (one-dimensional) model (of the target structure) and a representation of amplitude variations using reflection coefficients of plane waves. A 1D model of a target structure is a model of a target structure that represents variations along one direction (e.g., depth direction) of the target structure. A plane wave represents an acoustic wave in the target structure that is generally planar.

In practice, the assumption of plane waves can restrict the offset range of acquired survey data that can be input into a waveform inversion algorithm. As noted above, near-critical reflections will not be accurately modeled, because the distortion caused by head waves will not be accounted for. As a result, longer-offset survey data (survey data acquired by survey receivers that are farther from the survey source) may not be useable in some AVO waveform inversion techniques. The restriction on the offset range that can be used for such AVO waveform inversion techniques can reduce accuracy in producing estimates of properties of the target structure.

As noted above, a type of forward modeling that can be employed with waveform inversion is a WKBJ forward modeling technique that produces a synthetic seismogram (also referred to as "seismogram" in the ensuing discussion). A WKBJ seismogram is constructed from ray-traced quantities (data computed based on tracing a ray path of a wave propagating through a target structure), and can account for non-geometric propagation phenomena, such as distortion caused by a head wave with a reflected signal. Hence, the WKBJ forward modeling technique allows a waveform inversion to be carried out using each of pre-critical survey data, near-critical survey data, and post-critical survey data.

A WKBJ forward modeling technique can also be computationally relatively efficient. For instance, the computational cost of synthesizing a WKBJ seismogram is proportional to a linear combination of the number of output samples ($n_t$) and the number of slownesses (representing respective plane waves) used in the computations ($n_p$)—in other words, the computational cost of synthesizing a WKBJ seismogram is proportional to $n_t + n_p$. Output samples refer to discrete output values produced in the WKBJ seismogram, and slowness refers to the inverse of velocity of a seismic plane wave in a target structure.

The computational cost of the WBKJ forward modeling technique is lower than the computational costs of other forward modeling techniques that may be proportional to $n_t \times n_p$. Additionally, the WKBJ forward modeling technique outputs a band-limited seismogram (a seismogram having frequency components within a certain band) that can be directly compared to acquired survey data, such that an intermediate step to map input survey data (in a time and offset domain) into reflection coefficients as a function of angle of incidence does not have to be employed. In addition, the WKBJ forward modeling technique does not assume that a target structure is isotropic, so that the WKBJ forward modeling technique can be used for anisotropic waveform inversions as well.

The WKBJ forward modeling technique is a form of a slowness-based forward modeling technique, in which the impulse response of a line or point source in a 1D earth model is obtained by inverting the frequency transform of a particle velocity Green function. The intermediate result is the impulse response for a fixed slowness, which can then be evaluated analytically or numerically.

The following provides further details of the WKBJ forward modeling technique that is useable to perform waveform inversion according to some embodiments.

The WKBJ solution for an impulse response of a given ray type (e.g., for a reflection or any of its multiples) is represented by $u_{ray}$ for each time t and each receiver Cartesian location $x_R$ (3D location of a survey receiver along x, y, z axes). The function $u_{ray}$ (which can be referred to as the WKBJ Green function) can be defined as:

$$u_{ray}(t, x_R) = -\frac{1}{2^{3/2}\pi^2 x_R^{1/2}} \times \frac{d}{dt} \text{Im}\left(\Lambda(t) * \sum_{\tilde{T}_{ray}=t} \frac{p^{1/2} G_{ray}(p)}{|\partial \tilde{T}_{ray}/\partial p|}\right). \quad \text{(Eq. 1)}$$

In Eq. 1, p is a lateral slowness component, such as the horizontal or x component, characterizing an incident plane wave, $x_R$ is a coordinate of the receiver along the x axis, and $\tilde{T}_{ray}$ is the traveltime function for the plane wave between a given survey source-receiver pair. The other parameters in Eq. 1 are discussed further below. The traveltime function $\tilde{T}_{ray}$ equals the geometric ray traveltime $T_{ray}$, if the survey receiver radial position $x_R$ (along the x axis) coincides with the range of the geometrical arrival $X_{ray}$ for the given p. The range of the geometric arrival $X_{ray}$ is the offset (distance) between the survey source and receiver positions in the source-receiver pair. Note that the geometric arrival is the arrival (waveform on the seismogram) corresponding to the ray that connects the survey source and survey receiver positions, while satisfying Snell's law (Snell's law provides a formula to describe the relationship between angles of incidence and refraction). More generally, $$\tilde{T}_{ray}(p,z_R)=T_{ray}(p,z_R)+p[x_r-X_{ray}(p,z_R)], \quad \text{(Eq. 2)}$$

where $z_R$ is the receiver depth. The main contributions to the summation in Eq. 1 come from the extrema of the traveltime function $\tilde{T}_{ray}$, which correspond to geometrical arrivals. As noted above, geometrical arrivals are the arrivals (waveforms on the seismogram) corresponding to the rays that obey Snell's law. These contributions, in turn, are scaled (in Eq. 1) by the propagation dyadic $\underline{\mathcal{G}}_{ray}(p)$, which encodes the polarization vectors $g_S$ and $g_R$ (that describe the particle movement in the medium of the subterranean structure when a seismic wave passes through the medium) at the source ($g_S$) and receiver ($g_R$) for a given slowness p, and the plane-wave reflection and transmissions coefficients, $T_{ij}$, along a ray:

$$\underline{\mathcal{G}}_{ray}(p)=(\Pi_{ray}T_{ij}(p))g_R(p)g_S^T(p). \quad \text{(Eq. 3)}$$

The transmission coefficients represented in $T_{ij}(p)$ of Eq. 3 provide indications of transmissivity of subterranean layers through which a seismic wave propagates. The reflection coefficients represented in $T_{ij}(p)$ of Eq. 3 provide indications of reflectivity of a seismic wave from subterranean layer(s), including a target reflector (such as 110 in FIG. 1). The transmission and reflection coefficients can be computed based on impedances of corresponding subterranean layers. In some implementations, a transmission coefficient is used to determine an amplitude of a seismic wave that propagates through a boundary of two subterranean layers. Similarly, a reflection coefficient is used to determine an amplitude of a seismic wave reflected from a boundary between two subterranean layers. In Eq. 3, the operator $\Pi_{ray}$ computes a product of the transmission and reflection coefficients $T_{ij}(p)$.

More generally, instead of reference to transmission coefficients and reflection coefficients, reference can be made to transmission information and reflection information, respectively. Transmission information relating to a boundary between subterranean layers can be used to determine a characteristic of a wave as it propagates through subterranean layers, while reflection information relating to a boundary between subterranean layers can be used to determine a characteristic of a wave reflected from the boundary (reflector).

As noted above, Eq. 1 models the response of a subterranean structure in response to incident seismic waves (where the response includes the reflected seismic waves that are reflected from the target reflector in the subterranean structure). Since Eq. 1 contains the propagation dyadic $\underline{\mathcal{G}}_{ray}(p)$ expressed in Eq. 3, it is noted that the WKBJ forward modeling technique that models the response of the subterranean structure uses reflection information (such as in the form of the reflection coefficients represented in $T_{ij}(p)$ of Eq. 3) of the target reflector.

The final shape of the impulse response seismograms is obtained by convolution with the operator $$\frac{d}{dt}\text{Im}[\Lambda(t)],$$

where $$\Lambda(t) = \lambda(t) + i\bar{\lambda}(t) = t^{-\frac{1}{2}}$$

is an analytic signal, Im is the imaginary part, and $i^2=-1$.

In some implementations, Eq. 1 is regularized before computation of the synthetic seismogram, because of singularities associated with $|\partial\tilde{T}_{ray}/\partial p|=0$. Eq. 1 can be smoothed with a time-domain boxcar filter $B(/\Delta t)/\Delta t$ that is twice as long as the sampling interval of the seismogram, where $$B(t)=\tfrac{1}{2}[H(t+1)-H(t-1)] \quad \text{(Eq. 4)}$$

and H (t) is the Heaviside step function. Then Eq. 1 can be rewritten as $$\frac{B(t/\Delta t)}{\Delta t}*\underline{u}_{ray}(t,x_R) \approx \quad \text{(Eq. 5)}$$
$$-\frac{1}{2^{3/2}\pi^2 x_R^{1/2}\Delta t} \times \frac{d}{dt}\text{Im}\left(\Lambda(t)*\sum_{\tilde{T}_{ray}=t\pm\Delta t}\int p^{1/2}\underline{G}_{ray}(p)dp\right).$$

The integrals are evaluated over the narrow slowness intervals defined by $\tilde{T}_{ray}=t\pm\Delta t$ and then summed to obtain the waveform amplitude for a given time instant t.

The function $u_{ray}$ (t, $x_R$) in Eqs. 1 and 5 represents the WKBJ Green function, which can be convolved with a predefined source signature s(t) and the boxcar filter B (t/$\Delta t$)/$\Delta t$ to derive a WKBJ synthetic seismogram $W(t, x_j)$, as represented by Eq. 6 below (the convolution is represented by *).

$$W(t,x_j) = s(t)*\frac{B\left(\frac{t}{\Delta t}\right)}{\Delta t}*\underline{u}_{ray}(t,x_j). \quad \text{(Eq. 6)}$$

The predefined source signature s(t) represents the signature of the source signal (such as that produced by the survey source 102 of FIG. 1).

Computing Eq. 6 for multiple time points provides a time series, called a synthetic seismogram W (t, $x_j$) (seismogram at multiple time points t), as the output of the WKBJ forward modeling technique for a given model of the subsurface.

Figure 3:
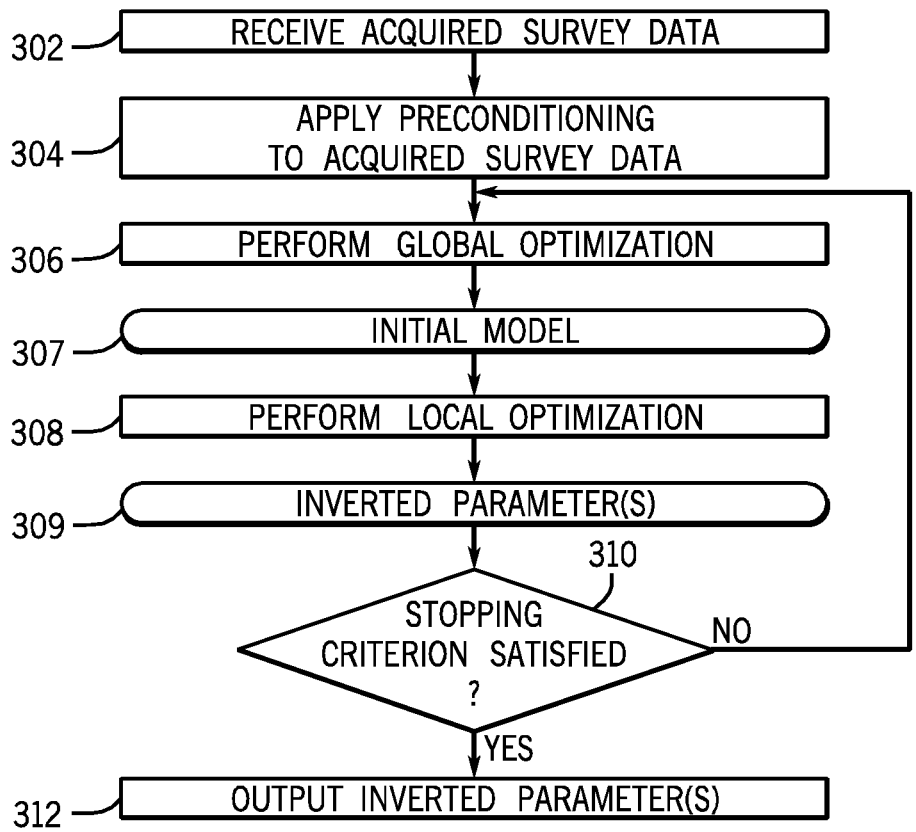

FIG. 3 is a flow diagram of a process according to further implementations. The process of FIG. 3 receives (at 302) acquired survey data, such as survey data acquired by the receivers 104-1 to 104-3 depicted in FIG. 1. In some examples, preconditioning can be applied to the received survey data. Preconditioning can include preprocessing to reduce ground roll noise and multiple reflections. Ground-roll noise refers to seismic waves produced by seismic sources that travel generally horizontally along an earth surface towards seismic receivers. Multiple reflections refer to seismic waves reflected from a surface, such as a land surface or a sea surface, where these seismic waves can be reflected back and forth between the surface and a subterranean reflector, or between a sea surface and an earth surface. Surface-related multiples can reduce accuracy of survey data interpretation.

Data preconditioning performed at 304 can also include convolution with the boxcar filter B(t/Δt)/Δt discussed above, such that the same smoothing applied to the WKBJ seismograms is used for the received survey data. Additionally, the preconditioning (304) can reduce contributions of survey data outside a predefined frequency range, since the WKBJ seismogram is also band-limited.

The process of FIG. 3 further performs two types of optimizations, a global optimization (performed at 306), and a local optimization (performed at 308). These two optimizations are performed in two different stages. The global optimization and local optimization are stages of the waveform inversion—each of the global and local optimization stages employs the WKBJ forward modeling technique according to some implementations.

The waveform inversion process is divided into the two stages 306 and 308 to avoid local minima. The global optimization stage (306) performs a search for an initial model (307) of the target structure in the vicinity of the global minimum of a cost function. The initial model (307) is used by the WKBJ forward modeling technique to estimate a response (seismograms) of a subterranean structure. The "cost function" can refer to the function that measures a residual, which is the misfit between actual survey data (received at 302) and synthetic data produced in the seismograms of the WKBJ technique. The cost function may measure the least-squares differences between actual survey data and synthetic survey data, or in another implementation, the cost function may measure the least-squares differences of envelopes of the actual survey data (waveforms) and synthetic data (waveforms), or other cost functions may be used. An envelope refers to the modulus of the analytic signal associated with a seismogram or difference of seismograms.

Performing a search for an initial model in the vicinity of the global minimum of the cost function in the global optimization stage (306) refers to finding an initial model that produces a minimum for the cost function (in other words, the misfit or difference between actual survey data and synthetic data in WKBJ seismograms is minimized).

The local optimization stage (308) uses the initial model (307) found in the global optimization stage (306) as the starting point for a gradient-based constrained optimization to produce at least one inverted parameter (309) that is an output of waveform inversion. The inverted parameter (309) represents a characteristic of the subterranean structure, such as an elastic property, density, and velocity.

The solution (one or more inverted parameters 309) of the optimization problem in the local optimization stage 308 can be found using any of various algorithms, such as a Levenberg-Marquardt algorithm (which produces a numerical solution to the problem of minimizing a function) or a sequential quadratic programming numerical optimization algorithm (which is an iterative technique for nonlinear optimization).

Due to the relatively fast speed of the computations of the WKBJ forward modeling technique, the process of FIG. 3 can be iterated multiple times to obtain different realizations of the inverted parameter(s) (309). The process of FIG. 3 determines (at 310) if a stopping criterion has been satisfied. In some examples, a stopping criterion is satisfied if the inverted parameter(s) produced by successive iterations of the FIG. 3 process differ by less than some predefined threshold. In other examples, a stopping criterion is satisfied if some predefined number of iterations has been performed.

Once the stopping criterion is satisfied, the latest realization of the inverted parameter(s) 309 produced by the waveform inversion is output (at 312) for use, such as to build a model based on the output parameter(s) 309 (e.g., a model of densities at different points in the subterranean structure, a model of velocities at different points in the subterranean structure, etc.).

By performing the waveform inversion processing in multiple iterations, it is also possible to derive a statistical distribution of the inverted parameters, where a statistical distribution can be represented as a normal distribution (having a mean and standard deviation) or other distribution.

The global optimization stage (306) of the FIG. 3 process can include a random or a Monte-Carlo type search throughout the parameter space to avoid local minima. For an isotropic medium, the parameter space is made up of the P- and S-wave interval velocities and densities describing both portions of the media above and below the reflector (e.g., 110 in FIG. 1), as well as the thickness of the medium immediately above the reflector, which determines the depth of the reflector. In case of an anisotropic medium, the velocities can be substituted by the appropriate sets of parameters (e.g., elastic stiffness tensor components).

As discussed above, the global optimization stage (306) performs a search for the initial model (307) in the vicinity of the global minimum of a cost function, which measures a residual that corresponds to the misfit between actual survey data and synthetic data in the seismograms of the WKBJ technique.

The residual is represented as a residual vector, which is defined as r=d−cw, where c is an overall scalar between the input survey data (D) and the synthetic data (W) (or alternatively, their respective envelopes $D_e$ and $W_e$). The survey data or its envelope is mapped into a column vector d, and the synthetic data or its envelope is mapped into a column vector w. The norm of r, normalized by the energy in the input survey data, can be minimized, with the additional constraint that the scalar c is found as part of the least-squares problem, i.e., the objective function to be minimized is $$E = 1 - \frac{<d, w>^2}{<d, d><w, w>}. \quad \text{(Eq. 7)}$$

As pointed out earlier, two types of misfit functions may be used during the inversion: one based on least squares differences between waveforms and another based on least squares differences of envelopes (modulus of the analytic signal). The data input into the envelope-based objective function is given by $$D_e(t,x_j)=|D(t,x_j)+i\overline{D}(t,x_j)|,$$

$$D_e(t,x_j)=\mathcal{H}\,[D(t,x_j)], \quad \text{(Eq. 8)}$$

where, $\overline{D}(t, x_j)$ is the Hilbert transform of $D_e(t, x_j)$. Hence, $D_e$ traces contain the magnitude of the complex trace obtained from $D_e(t, x_j)$. Likewise, the envelope of the WKBJ synthetic seismograms is defined as $$W_e(t,x_j)=\mathcal{H}\,[W(t,x_j)]. \quad \text{(Eq. 9)}$$

The local optimization stage (308) includes a local, gradient-based, constrained optimization using the best model found in the global search stage (308) as the starting guess.

The constraints, representing ranges of possible values for the model parameters, are inherited from the global search stage as well.

In some examples, a "reference slowness" parameter ($p_r$) accounting for lateral velocity variations can be introduced at the local optimization stage (308). The norm of the reference slowness parameter $p_r$ can be added to the objective function being minimized:

$$E = \frac{<d, w>^2}{<d, d><w, w>} + \lambda |p_r|^2, \qquad \text{(Eq. 10)}$$

where $\lambda$ is a scalar defining the relative importance of the parameter $p_r$ in the objective function. Lateral velocity variations can be caused by a local dip, where "dip" refers to a magnitude of inclination from a plane. The purpose of the reference slowness $p_r$ is to introduce a small time shift in the WKBJ seismogram traces (wavefronts), $t_r=p_r x$ (x is a relative trace offset), which improves the fit of the movement of the reflection event of the WKBJ seismograms to that of the data, as shown in FIG. 4.

Figure 4:
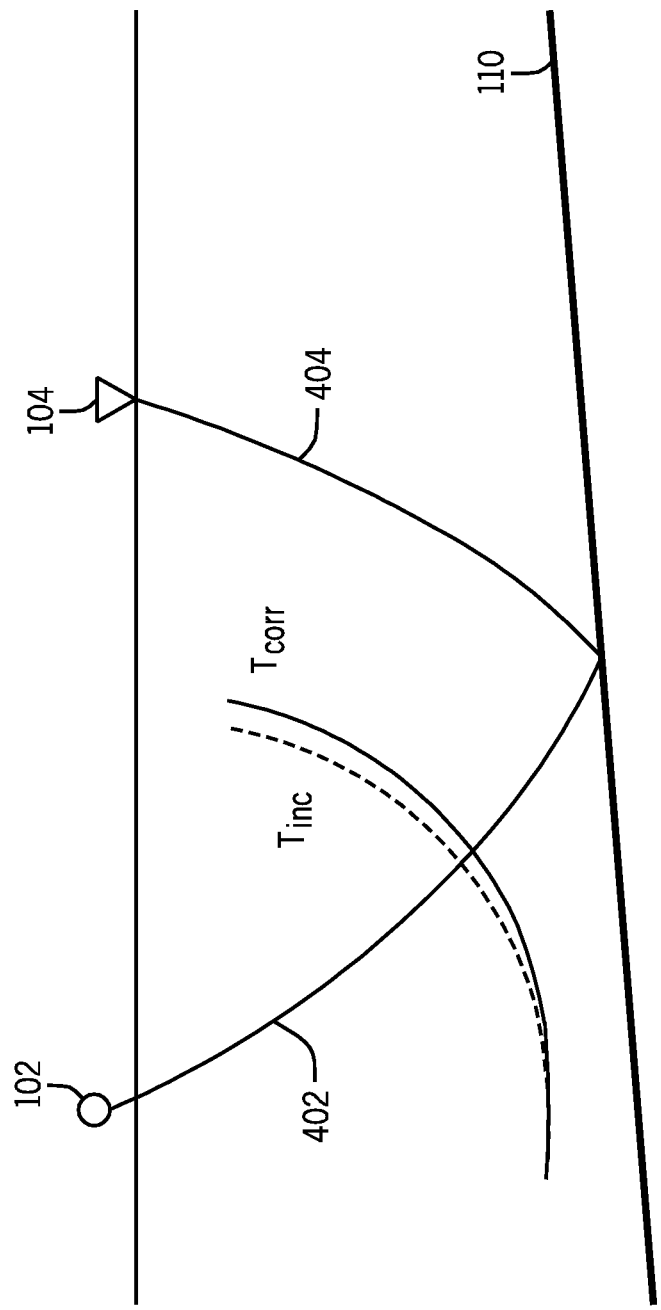
FIG. 4 is a schematic diagram showing a time shift of a seismogram wavefront, according to some implementations.

FIG. 4 shows an incident signal 402 produced by the survey source 102, which is reflected from the reflector 110 as reflected signal 404 (for detection by the survey receiver 104). FIG. 4 also depicts an original wavefront ($T_{inc}$) in a seismogram produced by the WKBJ forward modeling technique. Use of the reference slowness $p_r$ to introduce a small time shift results in the shifted wavefront ($T_{corr}$), which helps to account for lateral velocity variation in the subterranean structure.

In another implementation, waveform inversion employing WKBJ forward modeling, as discussed above for a target reflector, can be augmented by pre-critical angle AVO inversion at nearby or surrounding reflectors (above and/or below the target reflector). The AVO inversion for the nearby or surrounding reflectors can employ forward modeling techniques that do not account for reflected signal distortion, since the incident waves at the nearby or surrounding reflectors have incident angles less than the critical angle. The optimization problem then uses a combination of the traditional AVO inversion objective function for reflections from the nearby or surrounding reflectors and the WKBJ waveform inversion objective function discussed above (such as the objective function expressed in Eq. 7).

Figure 5:
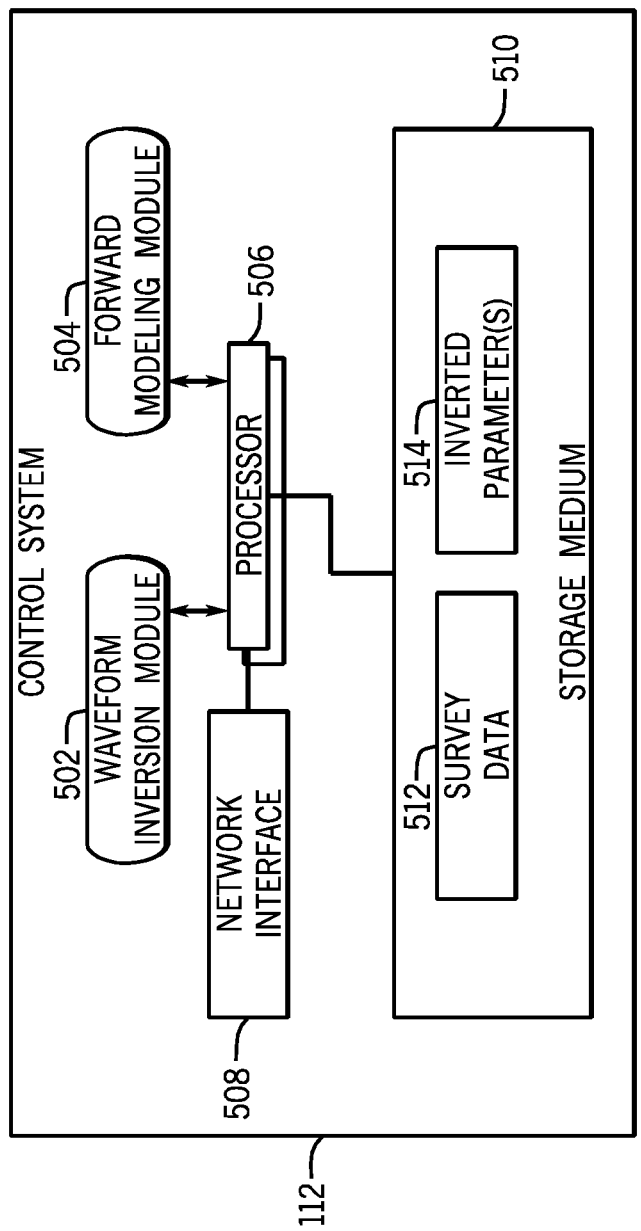
FIG. 5 is a block diagram of an example system incorporating some implementations.

FIG. 5 is a block diagram of an example of the control system 112 depicted in FIG. 1. The control system 112 includes a waveform inversion module 502 to perform tasks according to some embodiments, such as those depicted in FIG. 2 or 3. The waveform inversion module 502 includes a forward modeling module 504 that can perform the forward modeling discussed above, such as forward modeling according to the WKBJ technique.

The waveform inversion module 502 and forward modeling module 504 are executable on one or multiple processors 506. A processor can include a microprocessor, microcontroller, processor module or subsystem, programmable integrated circuit, programmable gate array, or another control or computing device.

The processor(s) 506 can be connected to a network interface 508 to allow the control system 112 to communicate over a network (wired and/or wireless network), and to a storage medium (or storage media) 510 to store various data, such as acquired survey data 512 and inverted parameter(s) 514 output by the waveform inversion module 502.

The storage medium or media 510 can be implemented as one or more computer-readable or machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A method comprising:
performing forward modeling to compute a response of a target structure that includes a reflector, the forward modeling using reflection information relating to the reflector and accounting for distortion, caused by a wave associated with at least energy that travels parallel to the reflector, of a reflected signal reflected from the reflector, wherein performing the forward modeling comprises performing WKBJ (Wentzel, Kramer, Brillouin, and Jeffreys) forward modeling that accounts for the distortion caused by the wave associated with at least the energy that travels parallel to the reflector; and
performing waveform inversion using the response of the WKBJ forward modeling and using each of pre-critical survey data, near-critical survey data, and post-critical survey data.

2. The method of claim 1, wherein the reflection information includes reflection coefficients relating to the reflector.

3. The method of claim 1, wherein the forward modeling accounts for distortion of the reflected signal due to an incident signal impinging on the reflector at a near-critical angle that is less than, at or greater than a critical angle.

4. The method of claim 3, wherein the wave associated with at least the energy that travels parallel to the reflector includes a head wave.

5. The method of claim 1, wherein performing the waveform inversion produces at least one parameter that represents at least one characteristic of the target structure.

6. The method of claim 5, wherein the at least one parameter is selected from the group consisting of a velocity, a density, and an elastic property.

7. The method of claim 1, wherein performing the waveform inversion comprises performing amplitude variation with offset (AVO) inversion.

8. The method of claim 1, wherein the WKBJ forward modeling is performed for the reflector that reflects the reflected signal in response to an incident angle in a near-critical range, the method further comprising performing amplitude variation with offset (AVO) inversion using forward modeling that does not account for distortion of a reflected signal reflected from a second reflector in the target structure in response to an incident signal that is at an angle less than a critical angle.

9. The method of claim 1, wherein performing the waveform inversion comprises using a reference parameter to account for local lateral variation in the target structure.

10. The method of claim 9, wherein the reference parameter includes a reference slowness parameter.

11. The method of claim 1, wherein performing the waveform inversion comprises performing a first optimization stage and a second optimization stage, the first optimization stage to find an initial model of the target structure, and the second optimization stage to produce the at least one parameter based on the initial model.

12. The method of claim 11, wherein the first optimization stage measures a misfit between actual survey data and synthetic data to find the initial model, the actual survey data acquired by survey receivers, and the synthetic data produced by the forward modeling.

13. The method of claim 12, wherein the misfit is between an envelope of the actual survey data and an envelope of the synthetic data.

14. The method of claim 1, further comprising preprocessing survey data acquired for the target structure to produce survey data corresponding to a virtual survey arrangement in the subsurface.

15. A system comprising:
at least one processor to:
compute a response of a target structure that includes partial and total reflections from a reflector in the target structure, wherein the response is computed using forward modeling that uses reflection information relating to the reflector, the forward modeling accounting for interference between a reflected signal from the reflector and a wave associated with at least energy that travels parallel to the reflector, wherein the forward modeling comprises WKBJ (Wentzel, Kramer, Brillouin, and Jeffreys) forward modeling that accounts for distortion caused by the wave associated with at least the energy that travels parallel to the reflector; and
based on the response, produce at least one parameter of the target structure using waveform inversion that uses each of pre-critical survey data, near-critical survey data, and post-critical survey data.

16. The system of claim 15, wherein the wave includes a head wave.

17. The system of claim 16, wherein the WKBJ forward modeling accounts for the distortion caused by the head wave.

18. The system of claim 15, wherein the at least one parameter is selected from the group consisting of an elastic property, density, and velocity.

19. The system of claim 15, wherein the target structure is a subterranean structure.

20. An article comprising at least one non-transitory machine-readable storage medium storing instructions that upon execution cause a system to:
perform forward modeling to compute a response of a target structure including a reflector, the forward modeling using reflection information relating to the reflector and accounting for distortion, caused by a wave associated with at least energy that travels parallel to the reflector, of a reflected signal reflected from the reflector, wherein the forward modeling includes WKBJ (Wentzel, Kramer, Brillouin, and Jeffreys) forward modeling that accounts for the distortion caused by the wave associated with at least the energy that travels parallel to the reflector; and
perform waveform inversion using the response of the WKBJ forward modeling and using each of pre-critical survey data, near-critical survey data, and post-critical survey data.

21. The article of claim 20, wherein performing the waveform inversion comprises using a reference parameter to account for local lateral variation in the target structure.

22. The method of claim 1, wherein the forward modeling accounts for distortion of the reflected signal caused by interference by the wave produced due to an incident signal impinging on the reflector at an angle that is at or greater than a critical angle.

23. The system of claim 15, wherein the forward modeling accounts for distortion of the reflected signal caused by interference by the wave produced due to an incident signal impinging on the reflector at an angle that is at or greater than a critical angle.

24. The article of claim 20, wherein the forward modeling accounts for distortion of the reflected signal caused by interference by the wave produced due to an incident signal impinging on the reflector at an angle that is at or greater than a critical angle.

* * * * *